United States Patent [19]

Harris

[11] Patent Number: 4,509,037
[45] Date of Patent: Apr. 2, 1985

[54] ENHANCED DELTA MODULATION ENCODER

[75] Inventor: Robert W. Harris, Ellicott City, Md.

[73] Assignee: Gould Inc., Rolling Meadows, Ill.

[21] Appl. No.: 446,012

[22] Filed: Dec. 1, 1982

Related U.S. Application Data

[63] Continuation-in-part of Ser. No. 272,983, Jun. 12, 1981, abandoned.

[51] Int. Cl.³ .......................................... H03K 13/22
[52] U.S. Cl. ................................. 340/347 AD; 375/28; 332/11 D; 340/347 NT
[58] Field of Search ................. 340/347 AD, 347 NT; 375/1, 26, 28–30, 34; 332/11 D

[56] References Cited

U.S. PATENT DOCUMENTS

| | | | |
|---|---|---|---|
| 3,244,808 | 4/1966 | Roberts | 375/1 |
| 3,273,141 | 9/1966 | Hackett | 375/28 |
| 3,490,045 | 1/1970 | De Boer | 375/30 |
| 3,516,022 | 6/1970 | Brolin | 375/28 |
| 3,825,831 | 7/1974 | Isaiguro | 340/347 AD UX |
| 4,161,633 | 7/1979 | Treiber | 375/34 |
| 4,313,204 | 1/1982 | De Freitas | 375/28 |

OTHER PUBLICATIONS

Panther "Modulation, Noise, and Spectral Analysis", McGraw Hill 1965, pp. 679–699 cited by applicant.
Winkler "High Information Delta Modulation" IEEE International Convention Record Part 8 1963, pp. 260–265 cited by applicant.

Primary Examiner—Charles D. Miller

[57] ABSTRACT

An improved analog-to-digital encoder comprising an enhanced delta modulation encoder. The enhanced delta modulation encoder includes a spectrum tilter, a 1 bit analog-to-digital converter, a sampling circuit and an internal decoder. An analog input signal and an internal analog signal from the internal decoder are summed to provide an analog dither which is essentially an internal error signal. The analog dither signal is tilted by the spectrum tilter and is provided to the 1 bit analog-to-digital converter which generates a digital signal. The sampling circuit receives the digital signal from the analog-to-digital converter and generates a digital output which is fed back to the internal decoder. The spectrum tilter comprises at least three integrator circuits and a clipping circuit connected in parallel to two of the three integrator circuits. The three integrator circuits tilt the frequency spectrum of noise above the maximum frequency of interest, and the clipping circuit prevents the encoder from becoming unstable. A digital filter may be connected to the output of the sampling circuit in order to filter the digital output to make it compatible with systems commonly employed to process the digital output.

29 Claims, 15 Drawing Figures

ENHANCED DELTA MODULATION ENCODER

CROSS REFERENCE TO RELATED APPLICATION

This is a continuation-in-part of my copending U.S. application Ser. No. 272,983, filed June 12, 1981 now abandoned.

BACKGROUND OF THE INVENTION

This invention relates to analog-to-digital encoders and in particular to an enhanced analog-to-digital encoder which employs delta modulation.

There is a wide range of commercial, industrial, scientific and military systems which are employed for high accuracy sensing of a variety of physical phenomena. Many of these systems convert the sensed analog data to digital data which may be readily transmitted and processed without degrading the dynamic range, resolution, phase or linearity of the data. In these systems the analog signals provided by the sensors (e.g., microphones, hydrophones, geophones, optical sensors, infrared sensors, image scanners, magnetic field sensors, etc.) are prepared for digitization by signal conditioning electronics including, for example, pre-amplifiers, equalizers, controlled gain circuits, anti-alias filters, sample and hold circuits, etc. The conditioned analog signals are then digitized by analog-to-digital encoders. The primary cause for limited data fidelity and inadequate system performance is the distortion and noise introduced into the data signal by the A/D encoder and by the signal conditioning electronics.

In most systems, the best fidelity achievable by current A/D encoders with their corresponding signal conditioning circuits is 90–100 dB of signal to distortion ratio (SDR). Although there is no single universally applicable measure of A/D encoder fidelity (because of the many different applications and environments in which A/D encoders are employed), the signal to distortion ratio defined below is an accurate measure for a broad range of A/D applications.

As defined, the SDR does not encompass DC offset, scale factor error, or phase delay distortion. The SDR (as defined below) encompasses the following A/D encoder errors and performance terms: non-linearity (linearity); differential non-linearity (differential linearity); harmonic distortion; intermodulation distortion; quantizing noise; all other noise (Johnson, Gaussian, etc.); clipping; dynamic range (instantaneous, two-tone); resolution; and monotonicity. Thus, it can be seen from the above list, that the signal to distortion ratio (SDR) takes into account a large number of considerations relevant in the measure of A/D encoder fidelity.

In order to determine the SDR, a maximum signal frequency $F_{ms}$, which is the maximum frequency of interest in the spectrum of the sensed analog signal to which the A/D encoder will be applied, is assumed. Two sine wave tones (having tone frequencies of, for example, 71% and 83% of $F_{ms}$ and having equal amplitude) are combined and fed as an input test signal to the A/D encoder input. The A/D encoder output is subjected to spectral analysis and the distortion power is defined as the sum of all the A/D output power from zero frequency to $F_{ms}$ except for the energy right at zero frequency and that at the two frequencies in the input test signal. (Any noise which is lost in notching out zero frequency and the two test signal frequencies is estimated and added to the measured distortion power.) The sine wave equivalent signal power is defined as the square of the sum of the RMS amplitudes of the two tones in the input test signal, measured at the A/D encoder output. (This definition of sine wave equivalent signal power gives the power of a single tone test signal which would have the same peak to peak amplitude as the actual two-tone test signal.) The signal to distortion ratio (SDR) is defined as the maximum obtainable ratio, as the input signal strength is varied, of the above-defined sine wave equivalent signal power to the above-defined distortion power, and is conventionally expressed in decibels (dB). For A/D encoders which require that a sample and hold circuit precede them, the SDR is measured on the combined sample and hold circuit and A/D encoder.

There are a number of existing classes of methods for A/D encoding, including:

1. Integrate and Count Voltage-to Frequency and Count
2. Successive Approximation
3. Delta Modulation Delta Sigma Modulation
4. Flash Conversion
5. Josephson Junction Devices The class 1 encoders (Integrate and Count and Voltage-to-Frequency and Count) are very slow and are used mainly in digital volt meters and digital multimeters where the measured analog signal is assumed to be stationary.

The class 2 encoders (Successive Approximation) cannot maintain signal to distortion ratio performance above 90–100 dB because of drift, with time and temperature, of resistor (or capacitor) ratios. These encoders have extremely high sensitivity to component ratios, and require a sample and hold circuit and an anti-alias filter to precede them in most applications. These additional circuits can add substantial distortions to the system. Despite the drawbacks of class 2 encoders, they offer the best performance of the five above-mentioned classes for a broad range of applications.

The class 3 encoders (Delta Modulation and Delta Sigma Modulation) generate data too voluminously, for example, a single integrator implementation of this class of encoder generates 20,000 bits per cycle of input signal at the maximum frequency of interest ($F_{ms}$) in order to achieve 120 dB of SDR. This high output data rate relative to the true information content causes untoward difficulties in processing, storing and transmitting the data. The SDR of this class of encoder is governed by a noise floor of so-called "granular noise" (which is a form of quantizing noise). A single integrator implementation of this class of encoder gains only 9 dB of granular noise reduction, and thus gains only 9 dB of SDR, for each doubling of its output bit rate relative to the maximum frequency of interest of its input signal. Therefore, the bit rate required grows exponentially with increasing SDR. Due to this exponential bit rate growth, this class of encoder is most useful for low SDR applications. Double integration implementations of this class of encoder can achieve 15 dB of SDR growth per doubling of bit rate and are therefore useful for applications of medium SDR. However, even with double integration the output bit rate is impractically high for applications requiring 100 dB or more of SDR.

The class 4 encoders (Flash Conversion) are limited to low SDR applications (approximately 60 dB) since each additional 6 dB of SDR doubles the complexity of the flash converters. Thus, the flash converters are not suitable for high SDR (100 dB or more) applications but instead are more suitable for very high bandwidth signals.

The class 5 encoders (Josephson Junction devices) are not in present commercial use. These devices will operate on the unique quantizing properties of Josephson junctions and offer very high speed and accuracy. However, they will require a cooling system to keep them within several degrees of absolute zero, thereby making them suitable only for specialized applications.

In summary, there is a need in the art for an analog-to-digital encoder having a high signal-to-distortion ratio, having a low data rate relative to the signal frequency bandwidth of interest, and having a reduced amount of granular noise.

SUMMARY OF THE INVENTION

It is an object of the present invention to provide an analog-to-digital encoder which overcomes the deficiencies of prior art encoders.

In particular, it is an object of the present invention to provide an analog-to-digital encoder having a signal to distortion ratio of at least 120 dB.

It is a further object of the present invention to provide an analog-to-digital encoder which reduces signal conditioning errors and cost by overcoming the necessity of providing a sample and hold circuit, an anti-alias filter and a controlled gain amplifier which are required in certain existing analog-to-digital encoders.

A still further object of the present invention is to provide an analog-to-digital encoder having a lower data output rate than existing delta modulation encoders and delta sigma modulation encoders, while providing comparable or better SDR performance for the same frequency band of interest.

It is a still further object of the present invention to provide an analog-to-digital encoder including a filter for providing a filtered digital output which is compatible with standard data processing equipment.

The analog-to-digital encoder of the present invention has a number of unique features and advantages as set forth above. The analog-to-digital encoder of the present invention is an enhanced delta modulation encoder (EDME) which employs the established delta modulation technique in an entirely novel manner. The enhanced delta modulation encoder of the present invention performs A/D encoding with higher accuracy, linearity, dynamic range and signal-to-distortion ratio than previously possible for signals of bandwidth in the range of approximtely 300 Hz to 300 kHz. It is capable of at least 120 dB of SDR performance over most of this range, while the next best method of A/D conversion in this frequency range (Successive Approximation) is limited to 90 to 100 dB of SDR. Further, the SDR of the enhanced data modulation encoder of the present invention is more stable with time and temperature than that of the successive approximation encoder. Below 300 Hz signal bandwidth, the enhanced delta modulation encoder's excellent SDR can be matched by delta sigma modulation and delta modulation encoders. However, the enhanced delta modulation encoder of the present invention has a much lower output bit rate than either of these encoders. The enhanced delta modulation encoder can reduce system size, power and cost when replacing the successive approximation encoder because it eliminates the need for an anti-alias filter and a sample and hold circuit. A total system employing enhanced delta modulation encoding contains fewer non-integrable analog components than does a system employing a successive approximation encoder. Furthermore, the decoder which may be employed to decode the output of the enhanced delta modulation encoder has a much lower cost than does the decoder for other A/D encoders except for the delta modulation encoder and the delta sigma modulation decoder. This feature is potentially beneficial for the future of digital audio high fidelity recording. Thus, recording enhanced delta modulation encoder code on records could reduce player cost since any player for digital hi-fi records will include a decoder.

The enhanced delta modulation encoder of the present invention includes a spectrum tilter which makes the encoder of the present invention capable of achieving very high fidelity A/D encoding (at least 120 dB of SDR) while avoiding the impractically high bit rates which are required by existing delta modulation and delta sigma modulation encoders. For example, the enhanced delta modulation encoder of the present invention achieves high fidelity (at least 120 dB of SDR) at approximately 1/100th of the clock rate required by delta modulation encoders and delta sigma modulation encoders implemented by a single integrator. In addition, the enhanced delta modulation encoder of the present invention achieves high fidelity at a substantially lower clock rate than that required by delta modulation encoders and delta sigma modulation encoders implemented by a double integrator.

The enhanced delta modulation encoder output can be digitally processed using standard digital filter technology. Signal conditioning such as equalization and band limiting which is conventionally done prior to A/D encoding may now be done digitally after enhanced delta modulation encoder encoding. An enhanced delta modulation encoder with a programmable digital post processor can thus implement an encoder with programmable signal conditioning. This approach (shifting the signal conditioning to the digital domain) enables the signal conditioning to be more accurate and more stable than analog domain signal conditioning. In addition, it allows the signal conditioning to be programmable. The high dynamic range of the enhanced delta modulation encoder makes this approach possible. A digital post-processor or filter connected to the enhanced delta modulation encoder can convert its data format to a multi-bit per sample form at a reduced sample rate. The sample rate must only meet the Nyquist criterion for the signal as it exists after any signal conditioning. Since a digital post-processor can implement stable and accurate anti-alias filtering, the enhanced delta modulation encoder connected to a post-processor can operate in the same manner as the successive approximation encoder output format, without incurring the phase and gain drift, the noise, the phase delay distortion, etc. of an analog anti-alias filter.

The serial, wordless, bit democratic nature of the enhanced delta modulation encoder output is an advantage in many cases. It can reduce the complexity of telemetry or recording and playback hardware in applications where the A/D encoder output must be telemetered or recorded, because telemetry channels and recording media generally provide a bit serial format.

These together with other objects and advantages which will become subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1A:
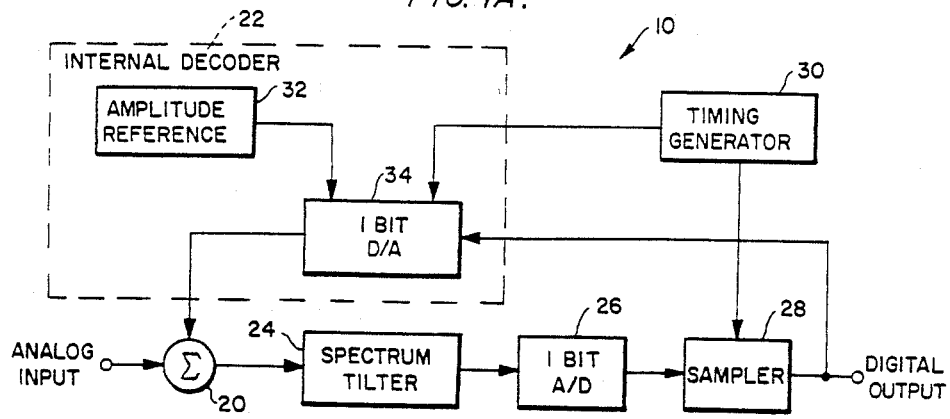
FIG. 1A is a block diagram of the enhanced delta modulation encoder of the present invention.

FIG. 1A is a block diagram of the enhanced delta modulation encoder 10 of the present invention, in which an analog summer 20 forms an analog dither signal by summing an analog input signal and an internal analog signal generated by an internal decoder 22. A spectrum tilter 24 processes the analog dither signal and generates a flattened analog signal. Under normal signal conditions, the spectrum tilter 24 functions as a linear analog filter. A 1 bit A/D converter 26, which is a comparator in the preferred embodiment, converts the polarity of the tilted analog signal to a digital signal. A sampling circuit 28 periodically samples the digital signal output by the 1 bit A/D converter 26, in dependence upon a timing signal from a timing generator 30, so that the bit rate of the digital output is governed by the timing signal generated by the timing generator 30 and generates the enhanced delta modulation encoder's digital output which is a serial bit stream. The enhanced delta modulation encoder output is a serial bit stream without word boundaries (although it can be transmitted or stored, etc., in words of any convenient size). Thus, the enhanced delta modulation encoder 10 produces a digital output in which, in any decoding process, the bits have equal weight and each bit is operative at a unique time. In contrast, the digital output of an N-bit sampling A/D encoder (i.e., any of the A/D encoders from the above-mentioned classes 1–2 and 4–5) has an inherent word structure with N-bits per word, and with a ranking of bits within the word. The lack of word structure in the enhanced delta modulation encoder's output simplifies its transmission, recording, storage, and playback, because the transmission or recording medium need not contain word boundary information. In the preferred embodiment, the sampling circuit 28 comprises a 1 bit digital sampler or a flip-flop.

Figure 6:
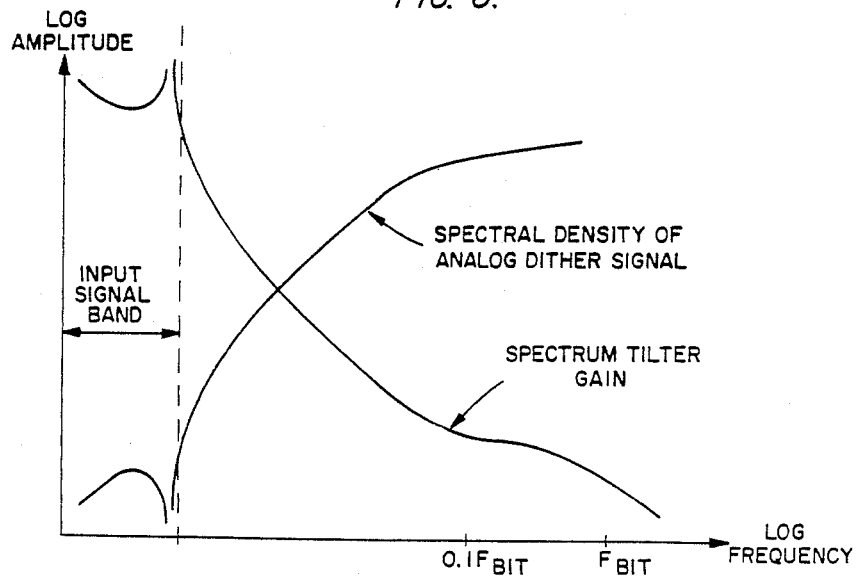
FIG. 6 is a graph for illustrating the gain of the spectrum tilter 24 and the spectral density of the internal analog dither signal provided to the spectrum tilter 24 of FIG. 1A.

The digital output of the sampling circuit 28 is fed back to the internal decoder 22 which receives a timing signal from the timing generator 30. The internal decoder 22 comprises an amplitude reference 32 and a 1 bit digital-to-analog converter 34. The 1 bit digital-to-analog converter generates the internal analog signal in dependence upon the digital output and the timing signal from the timing generator 30. The internal analog signal is a pulse signal in which one pulse is generated for each bit of the digital output. The area under a particular pulse is determined by the corresponding bit of the digital output from two possible values supplied by the amplitude reference 32. The analog input signal is a signal having spectral contents in a predetermined frequency band of interest. In addition, the analog input signal may have spectral contents outside the frequency band of interest. The analog input signal and the internal analog signal are summed together to form an analog dither signal. (As defined herein, the analog dither signal is a small varying signal corresponding to the difference between the internal analog signal and the analog input signal.) The portions of the analog input signal within the frequency band of interest cancel with the portions of the internal analog signal which are within the frequency band of interest, so that the analog dither signal is, in effect, an analog difference signal. The spectral content of the analog dither signal within the frequency band of interest is very low. The feedback, i.e., the internal analog signal, tracks the input analog signal for the frequency band of interest because in that region the spectrum tilter 24 has a very high gain. Referring to FIG. 6, it has been experimentally demonstrated that the spectral shape of the flattened analog signal at the output of the spectrum tilter 24 is flat. This is equivalent to stating that the spectral shape of the analog dither signal closely approximates the inverse of the frequency response of the spectrum tilter 24. The spectrum tilter 24 has very high gain within the input signal spectral band, thus the analog dither signal has very little energy in the frequency band of interest. The low spectral density of the analog dither signal within the analog input signal's frequency band of interest indicates that the internal analog signal which is output by the internal decoder 22 tracks the analog input signal accurately within the analog input signal's frequency band of interest. Since the output of the internal decoder 22 is generated from the digital output of the sampling circuit 28, the digital output contains sufficient information to reconstruct an accurate image of the analog input signal.

The enhancement feature of the enhanced delta modulation encoder 10 is governed by the degree of tilt in the spectrum tilter 24. The accuracy of the enhanced delta modulation encoder 10 is proportional to the effective gain of the spectrum tilter 24 within the analog input signal spectral band, divided by the spectrum tilter's effective gain in the vicinity of the bit rate frequency $F_{BIT}$ down to approximately $0.1F_{BIT}$.

Figure 4:
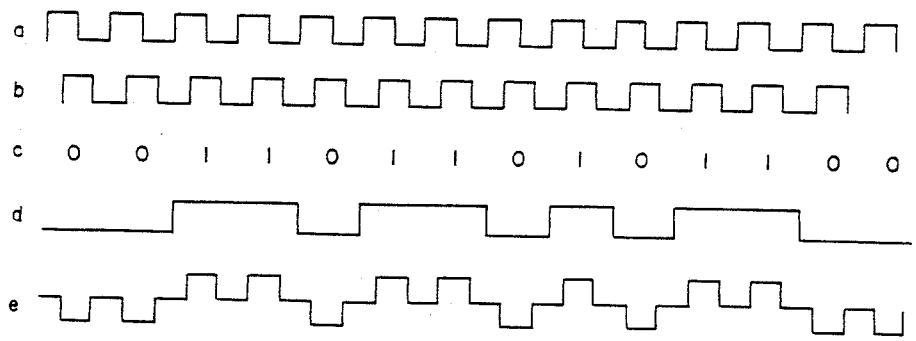
FIG. 4 is a timing diagram for illustrating the various signals described with reference to FIG. 1A.

Referring to FIG. 4, the various signals which have been discussed with respect to FIG. 1A are described. Row a of FIG. 4 illustrates the timing signal which is transmitted from the timing generator 30 to the sampling circuit 28. Row b illustrates the timing signal which is transmitted from the timing generator 30 to the 1 bit digital-to-analog converter 34 in the internal decoder 22. Row d of FIG. 4 illustrates the digital output signal which is output by the sampling circuit 28. Row c of FIG. 4 illustrates a data string comprising "0" and "1" bits, which is the data domain representation of the output signal which is output by the sampling circuit 28. As illustrated in rows a and d of FIG. 4, the bit rate of the digital output signal (row d) is governed by the timing signal (row a). Row e in FIG. 4 illustrates the internal analog signal which is generated by the 1 bit D/A converter 34 in the internal decoder 22. As illustrated in row e, the internal analog signal is a pulse signal which is dependent upon the timing signal (row b) and the data value of the digital output signal (row c).

A key element of the enhanced delta modulation encoder 10 is the spectrum tilter 24. As noted above, the spectrum tilter normally functions as a linear filter and, as a result, the desirable tilt which is produced by the spectrum tilter 24 also causes a phase lag which threatens the stability of the negative feedback loop of the encoder. In linear system control theory, a rule of thumb for stabilizing negative feedback loops states that if the phase lag is maintained at less than 180° at all frequencies up to the frequency of unity loop gain, the feedback loop will be stable. In fact, the more accurate statement of the law is that there can be any phase lag (including greater than 180°) below the unity loop gain frequency but the phase lag must be less than 180° at the unity loop gain frequency. Thus, if the phase lag is greater than 180° at low frequencies (below unity gain) then a conditionally stable system exists, so that if the loop gain is reduced sufficiently to bring the unity loop gain frequency down into a region where there is more than 180° of phase lag, the system becomes unstable.

The spectrum tilter 24 has less than 180° of phase lag in the frequency region from approximately $0.1F_{BIT}$ to $F_{BIT}$ and substantially more than 180° of phase lag below $0.1F_{BIT}$. The tilt is correspondingly strong below $0.1F_{BIT}$ and weak between $0.1F_{BIT}$ and $F_{BIT}$. The relatively low phase lag in the region from $0.1F_{BIT}$ to $F_{BIT}$ provides the enhanced delta modulation encoder feedback loop with a stable operating mode. However, the existence of a greater than 180° phase lag at frequencies below $0.1F_{BIT}$ means the enhanced delta modulation encoder feedback loop has the potential for limit cycles, i.e., self-sustaining abnormally large signals in the feedback loop. For this reason, the spectrum tilter 24 includes a clipper 36 (see FIG. 3) which reduces the phase lag to less than 180° at all frequencies below $F_{BIT}$ whenever any abnormally large signal occurs within the spectrum tilter 24. Thus, since limit cycles are characterized by abnormally large signals within the spectrum tilter 24, the clipper 36 prevents limit cycles from persisting. Although the clipper is a non-linear element and its phase lag reduction carries a concomitant reduction in spectral tilt, it does not interfere with the normal action of the spectrum tilter because during normal operation of the enhanced delta modulation encoder 10 the signal level in the spectrum tilter 24 is below the threshold of the clipper 36, i.e., the clipper 36 is inactive. Thus, the clipper 36 makes possible the large spectrum tilt which is responsible for the suppression of granular noise within the input signal spectral band of interest. Without the clipper 36, the enhanced delta modulation encoder 10 could go irreversibly into a limit cycle at power-up time or following an external disturbance such as a transient occurring on its power supplies, its input signal going beyond full scale, or a burst of RF energy impinging on it.

Figure 7:
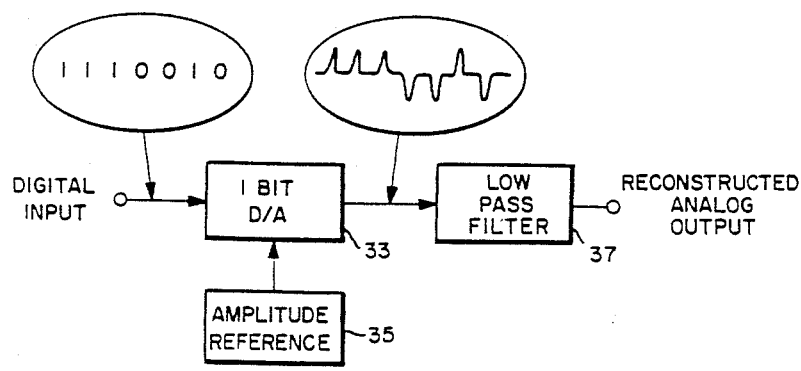
FIG. 7 is a block diagram illustrating an embodiment of a decoder which can be employed to decode the digital output of the enhanced delta modulation encoder of FIG. 1A.

FIG. 7 illustrates a block diagram of an embodiment of an external decoder which may be employed to decode the digital output signal of the enhanced delta modulation encoder 10 of the present invention. The external decoder includes a one bit digital-to-analog converter 33, an amplitude reference 35 and a low pass filter 37. The one bit D/A converter 33 converts the digital input bit stream (which is the sam digital output of the enhanced delta modulation encoder 10) to a pulse stream at one pulse per bit. The area under a particular pulse is determined by the corresponding bit of the digital output (i.e., the input bit stream to the decoder) from two possible values supplied by the amplitude reference 35. A low pass filter 37 passes all of the energy in the pulse stream which is spectrally less than or equal to the maximum signal frequency of interest $F_{ms}$ and filters out the energy which is spectrally above $F_{ms}$. The pulse train which is output by the one bit D/A converter 33 comprises a "true signal image" mixed together with a "dither signal". The dither signal is the difference between the pulse train of fixed size pulses and the true signal image. The low pass filter 37 filters out most of the dither signal because most of the energy in the dither signal lies spectrally above $F_{ms}$. The output of the decoder contains, as noise, only that portion of the dither signal which lies spectrally at or below $F_{ms}$.

It should be noted that the decoder of FIG. 7 is also a decoder which can be used with the delta sigma modulation encoder. The performance enhancement of the enhanced delta modulation encoder of the present invention over the delta sigma modulation encoder is due to the fact that the enhanced delta modulation encoder 10 reduces, to a greater extent, that portion of the analog dither signal which lies spectrally at or below $F_{ms}$. The enhanced delta modulation encoder 10 does this by tilting, to a greater extent, the spectrum of the analog dither signal, thereby moving more of the analog dither signal noise out of the signal pass band, allowing it to be eliminated by the low pass filter 37.

The true signal image which exists in the pulse train which is output by the one bit D/A converter 33 is not limited to frequencies at or below $F_{ms}$ but is a broad band image of the analog input signal. The true signal image consists of all the energy in the analog input signal which lies spectrally below half of the enhanced delta modulation encoder output bit rate. Input energy at frequencies up to half of the bit rate is not aliased (i.e., shifted to a different frequency). Input energy above half of the bit rate is aliased, but it is also attenuated to the extent that its strength at the new frequency is comparable to the strength of the dither signal at that frequency. Therefore, aliasing is not a problem in the enhanced delta modulation encoder 10 of the present invention and, as a result, the enhanced delta modulation encoder 10 requires neither an anti-alias filter nor a sample and hold circuit to precede it.

Since the true signal image within the pulse train output by the one bit D/A converter 33 contains a broad band image and is not limited to energy spectrally at or below some $F_{ms}$, the value of $F_{ms}$ can be changed by merely changing the cut-off frequency of the low pass filter 37 in the decoder (FIG. 7). The enhanced delta modulation encoder 10 does not need to be modified to change the maximum frequency of interest because the enhanced delta modulation encoder 10 normally encodes the input signal at frequencies far above the maximum frequency of interest.

In contrast to the decoder (FIG. 7) for the enhanced delta modulation encoder 10 of the present invention, the decoder for the delta modulation encoder requires that an analog integrator be connected between the one bit D/A converter 33 and the low pass filter 37. The integrator required in the decoder for the delta modulation encoder is tied in with several characteristic differences between the delta modulation encoder on the one hand, and the delta sigma modulation encoder and the enhanced delta modulation encoder 10 on the other hand. Thus, the delta modulation encoder has a large DC uncertainty and cannot effectively encode the DC portion of its input, whereas the enhanced delta modulation encoder 10 is capable of encoding DC and AC signals. In addition, the delta modulation encoder goes into overload at a particular signal slope, while the enhanced delta modulation encoder 10 goes into overload at a particular signal amplitude. As a result, the maximum sine wave signal capability of the delta modulation encoder is inversely proportional to the sine wave frequency, whereas the maximum sine wave signal capability of the enhanced delta modulation encoder 10 is independent of frequency. Therefore, the enhanced delta modulation encoder 10 has advantages over the delta modulation encoder because it has no slope limiting and no DC ambiguity.

The decoder illustrated in FIG. 7 can be implemented digitally as a digital low pass filter having a single bit per sample input from the enhanced delta modulation encoder 10 and having a multi-bit per sample output, and the output sample rate can be reduced by decimation (i.e., discarding selected samples) as long as the Nyquist criterion is observed (see FIGS. 8-12). In practice, the output sample rate can be reduced to approximately 2.5 $F_{ms}$ depending on the low pass filter cut-off rate. The digital low pass filter and decimator convert the enhanced delta modulation encoder output to the output code and format of an N-bit sampling A/D encoder. Since this is a digital process, it can be designed to maintain the data's signal to distortion ratio (SDR) and the output of the enhanced delta modulation encoder 10 can be converted (without loss of SDR) to a widely used code having the minimum practically achievable bit rate.

Figure 1B:
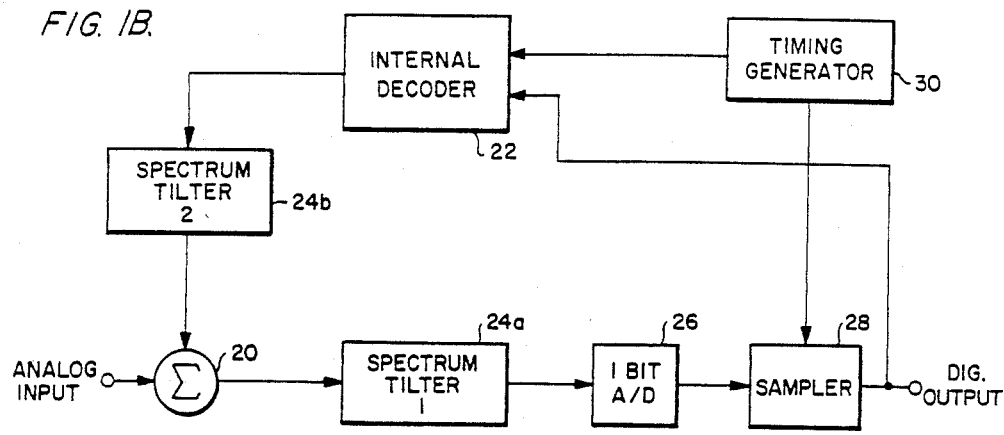
FIG. 1B is a block diagram of an alternate embodiment of the enhanced delta modulation encoder of the present invention.

FIG. 1B illustrates an alternate embodiment of the enhanced delta modulation encoder of the present invention where the spectrum tilter 24 is split into spectrum tilter one 24a and spectrum tilter two 24b. The spectral tilt which is produced by the spectrum tilter 24 may be inserted any place in the negative feedback loop to achieve the desired features of the present invention.

Figure 2A:
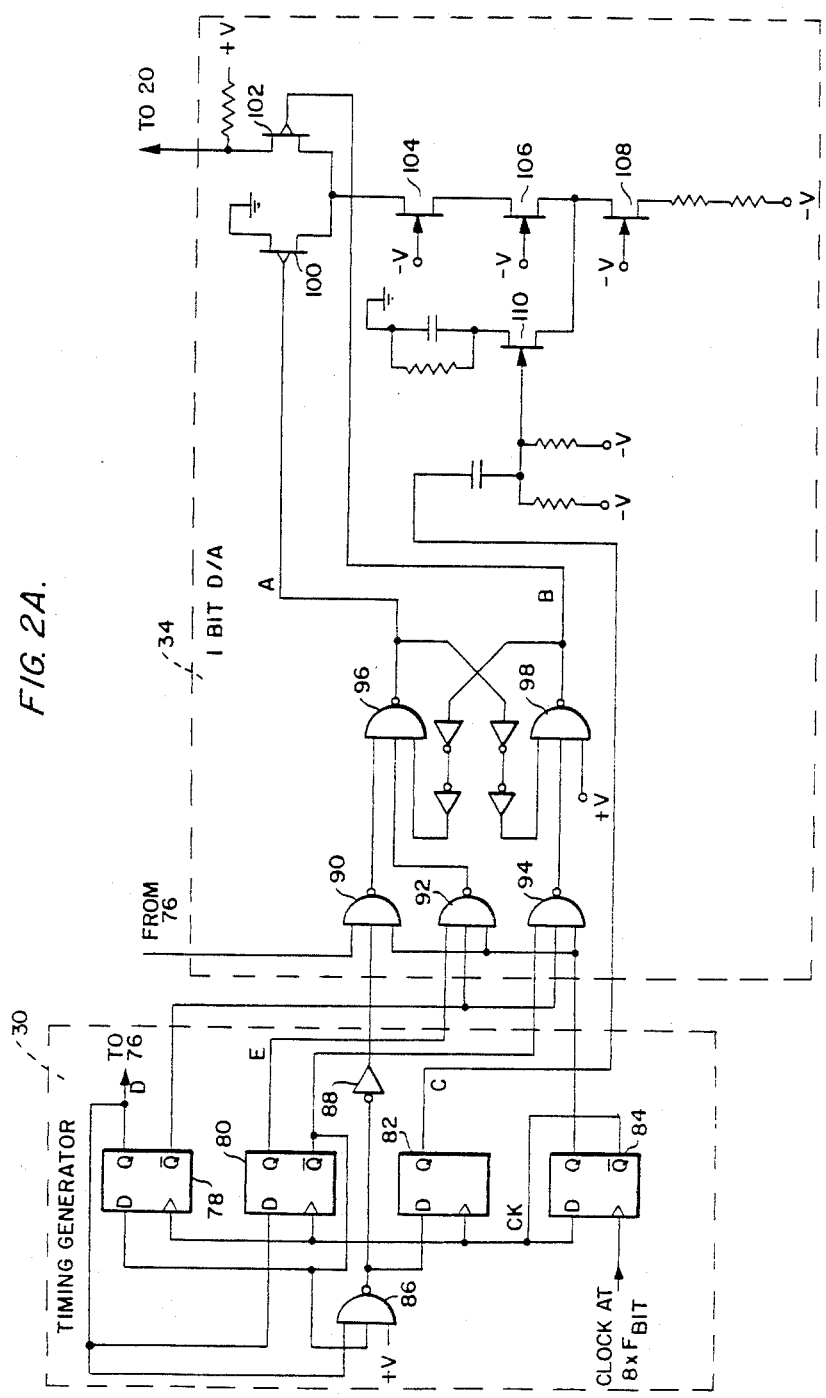
FIGS. 2A and 2B comprise a circuit diagram of the enhanced delta modulation encoder illustrated in FIG. 1A, including a first embodiment of the spectrum tilter 24 of FIG. 1A.
Figure 2B:
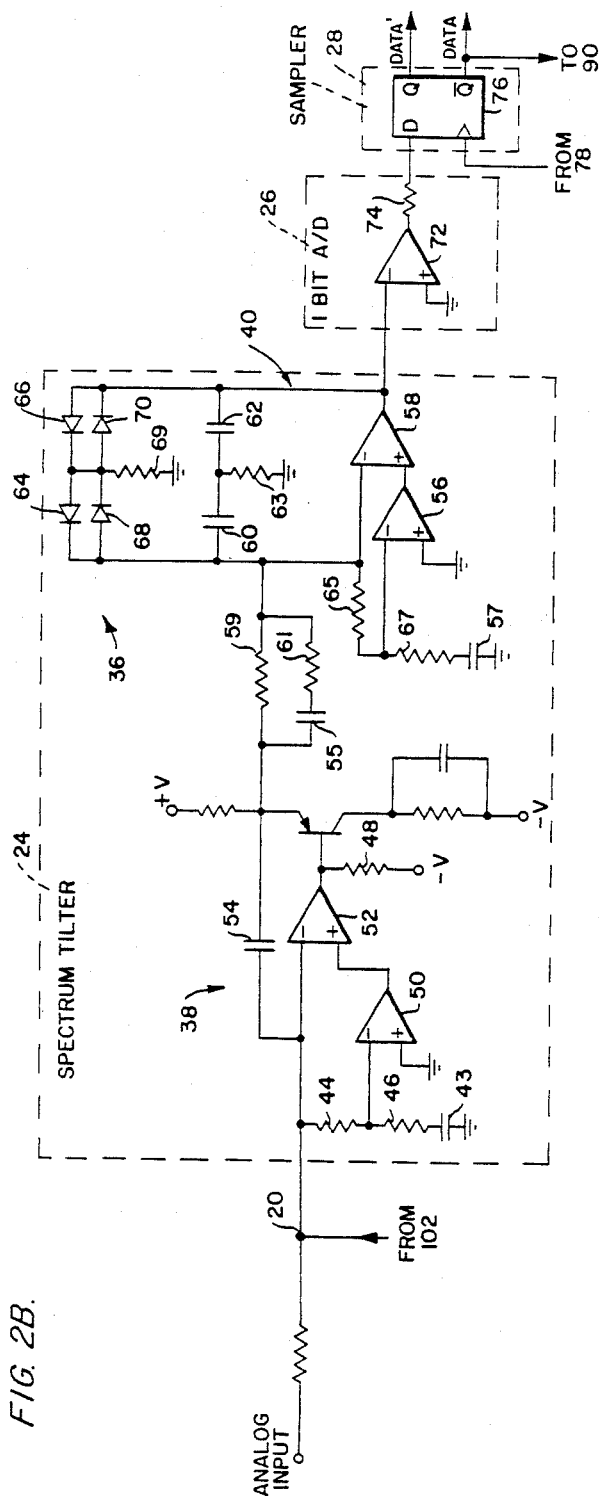

Referring to FIGS. 2A and 2B, a circuit diagram of the enhanced delta modulation encoder 10, including a first embodiment of the spectrum tilter 24, will be described.

The spectrum tilter 24 comprises three integrating circuits, which are implemented in this embodiment by an integrator 38 and a double integrator 40. The integrator 38 includes capacitor 43, resistors 44, 46 and 48, transistor 49, operational amplifiers 50 and 52, and an integrating capacitor 54. Resistors 44 and 46 and capacitor 43 provide compensation, so that operational amplifiers 50 and 52 cooperate to function as a single high quality operational amplifier. The double integrator 40 includes operational amplifiers 56 and 58, capacitors 55 and 57, resistors 59, 61, 63, 65 and 67, and integrating capacitors 60 and 62. Operational amplifiers 56 and 58, resistors 65 and 67 and capacitor 57 function in a manner similar to the previously described operational amplifiers 50 and 52, resistors 44 and 46 and capacitor 43. Capacitor 55 and resistor 61 provide phase lead in the vicinity of or above the freuqency of the bit rate. The resistor 63 establishes a zero of response in the complex frequency plane, which gives the double integrator 40 its double integrating characteristic. The clipper circuit 36 comprises four diodes 64, 66, 68 and 70 and resistor 69. With respect to this embodiment of the spectrum tilter 24, the phase lag below $0.1F_{BIT}$ approaches 270°: 90° for each of the integrating capacitors 54, 60 and 62. The clipper 36 nullifies 180° of this phase lag by effectively by-passing two of the integrating capacitors 60 and 62. Thus, the stability of the enhanced delta modulation encoder 10 is maintained.

The 1 bit A/D converter 26 comprises a comparator 72 and a resistor 74. The sampling circuit 28 comprises a flip-flop 76 which receives the digital signal from the resistor 74 and the timing signal from the timing generator 30, and which generates the digital output from its Q-output.

The timing generator 30 comprises four flip-flops 78, 80, 82 and 84, a NAND gate 86 and an inverter 88. The timing generator 30 generates a number of timing signals described below. The flip-flop 78 provides the timing signal, corresponding to row a in FIG. 4, to the sampling circuit 28 comprising the flip-flop 76. The remaining timing signals, corresponding to row b in FIG. 4, are provided to the 1 bit digital-to-analog converter 34 in the internal decoder 22.

The 1 bit digital-to-analog converter 34 comprises NAND gates 90, 92 and 94 which receive timing signals from the timing generator 30. The NAND gate 90 also receives the digital data output from the sampling circuit 28 comprising the flip-flop 76. The 1 bit digital-to-analog converter 34 further comprises NAND gates 96 and 98 which provide switching signals A and B. In this embodiment, the 1 bit digital-to-analog converter 34 is a charge pump and further includes P channel J FETS 100 and 102 which are turned on and off by the switching signals A and B. The charge pump 34 further comprises a ladder including transistors 104, 106, 108 and 110. In this embodiment, transistor 108 provides a predetermined constant current. Transistors 106 and 110 direct the predetermined constant current alternately so that when the current flows through transistor 110 it goes to ground and has no effect. When the current is directed through transistor 106 it flows through transistor 104 and is switched so that it flows either through transistor 100 to ground or through transistor 102, in dependence upon the switching signals A and B. If the transistor 102 is turned on and the current is directed through transistors 106 and 104, then the current is provided to the analog summer 20 which in the preferred embodiment is a current summing node 20. Thus, the current is directed through the chain of transistors 108, 106, 104 and 102, and is injected into the summing node 20 for a specific length pulse anytime a "1" bit is present at the digital output. The transistors 110 and 106 chop the predetermined constant current into pulses so that current is intermittently provided through transistors 104 and 106.

Figure 5:
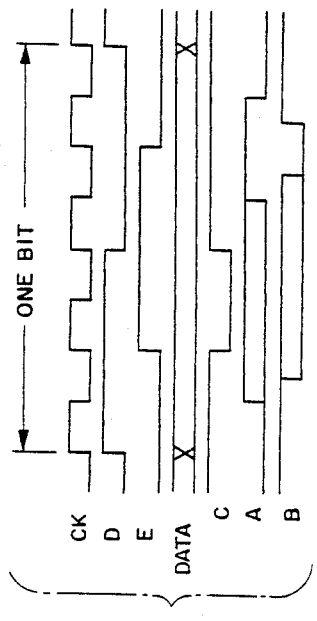
FIG. 5 is a timing diagram for illustrating the various signals described with reference to FIGS. 2A and 2B.

FIG. 5 is a graph illustrating the various signals corresponding to the letters referenced in FIGS. 2A and 2B. FIG. 5 illustrates a timing diagram for a single bit time and the X's (DATA) illustrate where the data can change. A clock signal CK provides four cycles per bit line. The timing signals D and E are always the same regardless of the logic value of the data signal. The timing signal C is always a down-going pulse near the middle of the bit time. When C is low, a current pulse flows through the transistors 104 and 106, and the transistors 100 and 102 are exposed to the current pulse. The timing signals A and B control transistors 100 and 102 in a data dependent manner such that transistors 100 and 102 never switch while they are exposed to a current pulse. Thus, each current pulse provided by transistors 104 and 106 is directed in its entirety to ground or to the summing junction 20. The timing signals A and B are generate so that there is a break before make action on the switches 100 and 102. This is done by staggering the edges of timing signal A with respect to the edges of timing signal B so that they are never simultaneously low, and thus transistors 100 and 102 are never simultaneously turned on.

Figure 3:
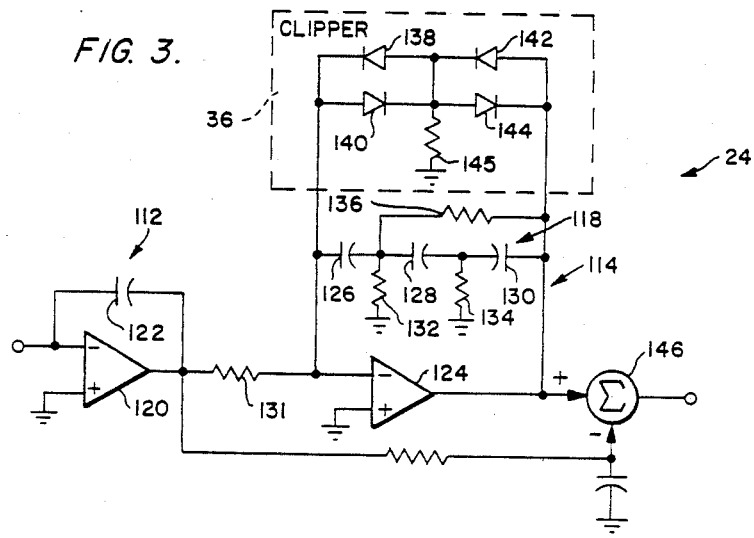
FIG. 3 is a circuit diagram of a second embodiment of the spectrum tilter 24 of FIG. 1A.

Referring to FIG. 3, another embodiment of the spectrum tilter 24 will be described. In this embodiment, the spectrum tilter 24 comprises four integrating circuits which are implemented by an integrator 112 and a triple integrator 114. The integrator 112 comprises an operational amplifier 120 and an integrating capacitor 122. The triple integrator 114 comprises an operational amplifier 124, integrating capacitors 126, 128 and 130, and resistors 131, 132, 134 and 136. As in the embodiment illustrated in FIG. 2A, the clipper circuit 36 comprises four diodes 138, 140, 142 and 144 and a resistor 145. A summer 146 sums the two signals which pass through the spectrum tilter 24.

In the embodiment of the spectrum tilter 24 illustrated in FIG. 3, the phase lag below $0.1F_{BIT}$ approaches 360°: 90° for each integrating capacitor 122, 126, 128 and 130. The clipper 36 nullifies 270° of this phase lag by by-passing the capacitors 126, 128 and 130. Because the linear filter configuration of the embodiment of FIG. 3 has two forward parallel signal paths meeting at the summer 146, it provides several benefits in spectrum tilter performance. The partial interference within the summer 146 between the two signal paths allows greater spectral tilt to be realized below approximately $0.1F_{BIT}$ while maintaining the necessary phase margin (i.e., phase below 180°) in the frequency range $0.1F_{BIT}$ to $F_{BIT}$. Since the clipper 36 operates only on the high phase leg of the spectrum tilter 24, the parallel signal path structure also insures low overall phase lag under sufficiently high signal level conditions, due to dominance of the low phase lag leg over the clipped high phase lag leg.

Figure 13:
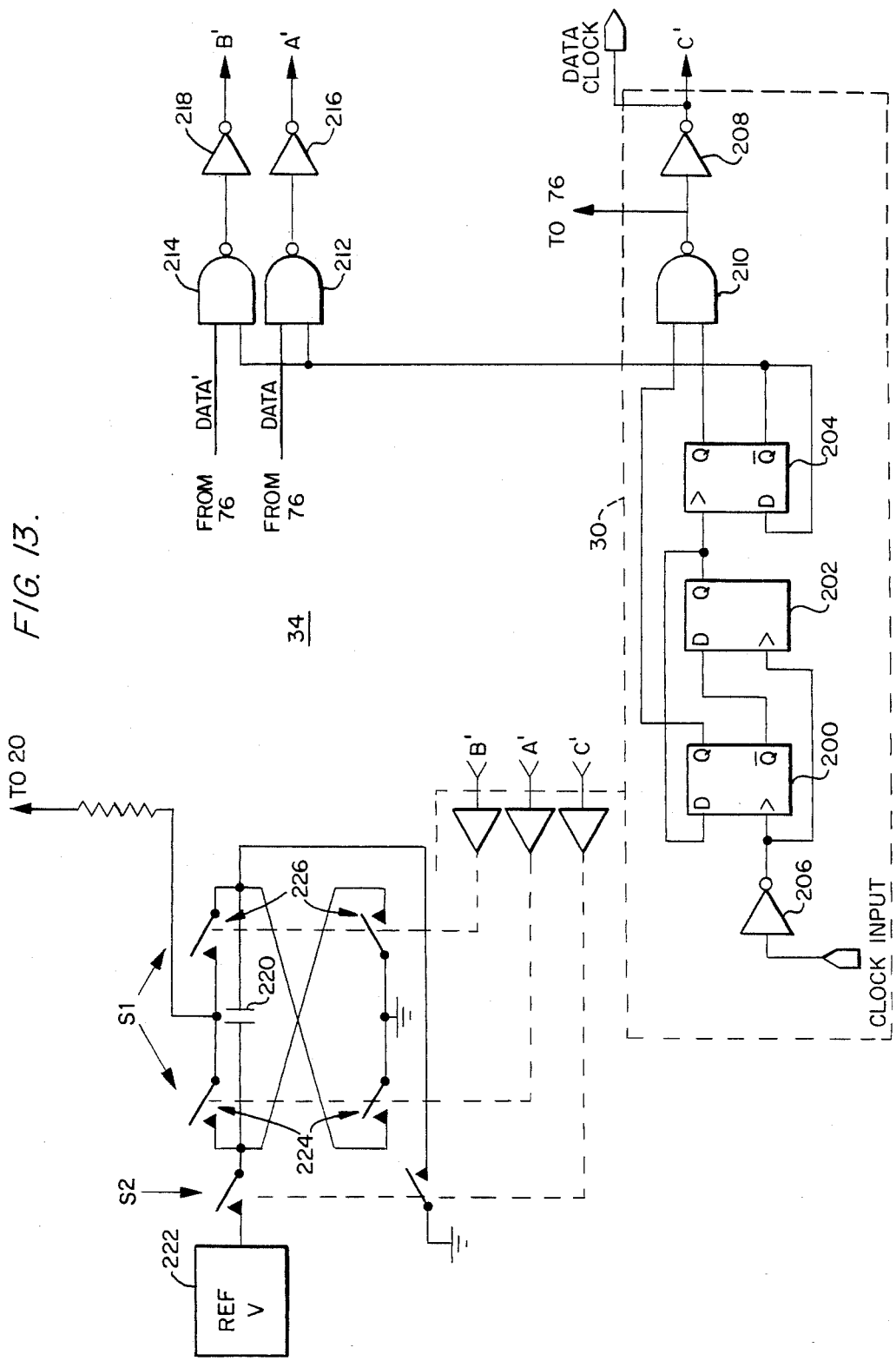
FIG. 13 is a circuit diagram of an alternate embodiment of the timing generator 30 and 1 bit D/A converter 34 of FIG. 1A.

FIG. 13 is a circuit diagram of a second embodiment of the timing generator 30, amplitude reference 32, and 1 bit D/A converter 34 of FIG. 1A. Referring to FIG. 13, the portions of the circuit which are within box 30 form the timing generator 30. Voltage reference source 222 forms the amplitude reference 32. The remaining portions of the diagram form the 1 bit D/A converter or charge pump 34. In this embodiment, the timing generator 30 comprises 3 flip-flops 200, 202 and 204, inverters 206 and 208, and a NAND gate 210. The timing generator 30 generates a number of timing signals similar to those dicussed above with respect to the embodiment illustrated in FIG. 2A. The NAND gate 210 provides the timing signal, corresponding to row a in FIG. 4, to the sampling circuit 28 comprising the flip-flop 76 (FIG. 2B). The remaining timing signals, corresponding to row b in FIG. 4, are provided to the 1 bit digital-to-analog converter 34 of the internal decoder 22. The voltage reference source 222 provides a reference voltage. The 1 bit digital-to-analog converter 34 comprises NAND gates 212 and 214 which receive timing signals from the timing generator 30. The NAND gates 212 and 214 also receive the digital output and the inverted digital output from the sampling circuit 28 comprising the flip-flip 76. The 1 bit digital-to-analog converter 34 further comprises inverters 216 and 218 which invert the outputs of NAND gates 212 and 214, respectively, to provide switching signals A' and B', respectively. In this embodiment, the 1 bit digital-to-analog converter 34 further comprises a charge pump including a flying capacitor 220 and switches S1 and S2. The switch S2 includes two switching elements operating in tandem under the control of a clock signal C' generated by the timing generator 30. Similarly, the switch S1 includes two pairs of tandemly operated switch elements 224 and 226 which are controlled by switching signals A' and B' respectively. In this embodiment, the flying capacitor 220, which may be a 470 pf capacitor, is charged up to the reference voltage under the control of the switch S2 actuated by the clock signal C'. On each bit of the digital output, the capacitor 220 is charged through S2 and is then discharged through one side or the other of the switch S1 in dependence upon whether the bit was a "1" or a "0". The discharge of the capacitor 220 is always into the summing junction 20 which is a current summing node in this embodiment. Only one of the switch element pairs 224 and 226 is operated at one time, since only one of the switching signals A' and B' is "on" at any one particular time. The discharge of capacitor 220 provides a fixed size current pulse or charge packet to summing junction 20, at one pulse per bit time. The polarity of the current pulse provided by the discharge of capacitor 220 is controlled by which side of switch S1 is operated, and is thus controlled by whether the bit provided by sampler 28 is a "1" or a "0".

Figure 8:
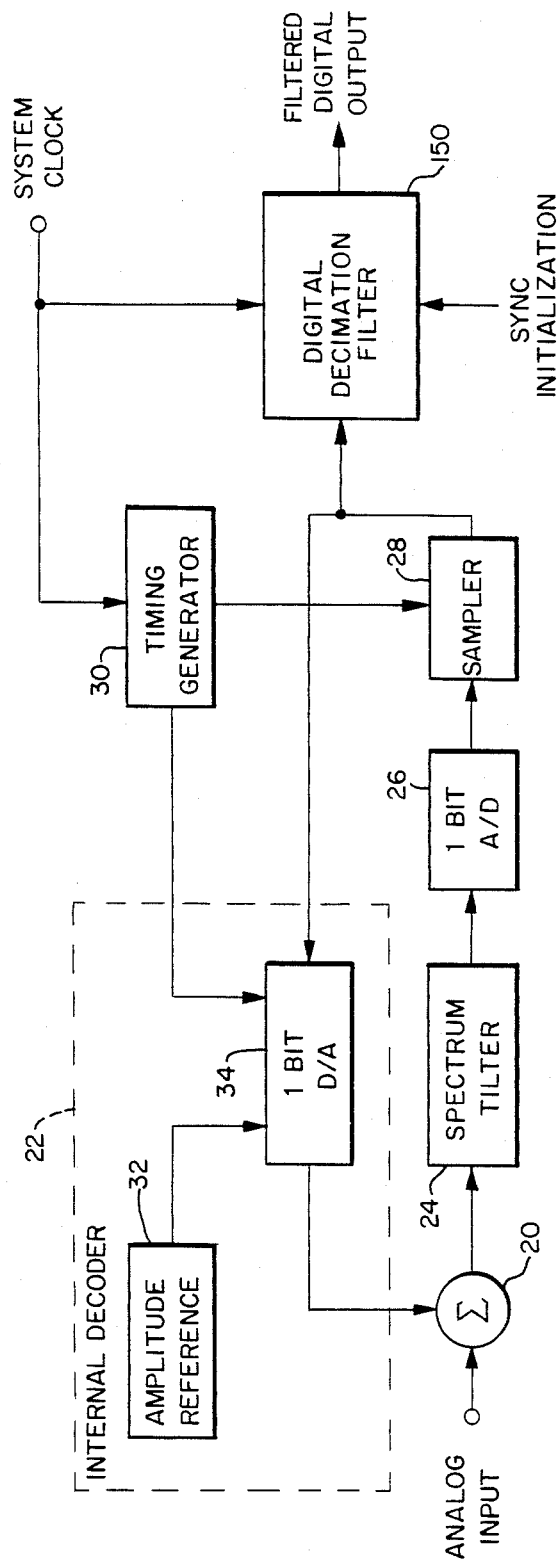
FIG. 8 is a block diagram of an embodiment of the present invention in which the output of the enhanced delta modulation encoder 10 of FIG. 1A is connected to a digital decimation filter 150.

In one embodiment of the present invention, the digital output of the sampling circuit 28 is filtered by a digital filter in order to obtain a filtered digital output in a more conventional format which is compatible with, for example, standard data processing systems. Since a wordless, bit-serial digital output is output by the sampling circuit 28, digital filtering may be required in order to make the digital output compatible with the receiving system. FIG. 8 is a block diagram of an embodiment of the present invention wherein the enhanced delta modulation encoder incorporates a digital decimation filter 150 for filtering the digital output of the sampling circuit 28. This embodiment is essentially the same as the embodiment of the present invention illustrated in FIG. 1A (alternatively, the digital decimation filter 150 could be connected to the embodiment of FIG. 1B) except for the addition of the digital decimation filter 150. The operation of the enhanced delta modulation encoder is identical to that described above with respect to FIG. 1A, except for the added filtering of the digital output.

The digital decimation filter 150 is capable of receiving a synchronization initialization signal for use in instances where synchronization of the digital decimation filter is required. Thus, the digital decimation filter 150 provides output digital words at specific sampling times which can be altered by the synchronization initialization signal. In addition, if multiple encoding systems are to be employed in coordination, the use of the synchronization initialization signal will allow the sampling times of the systems to be synchronized.

The digital decimation filter 150 receives an input (one bit per sample) at one sample rate and produces an output (multi-bit per sample) at a lower sample rate. In the embodiment of FIG. 8, each bit output by the sampling circuit 28 is a single sample and the output sample rate of the sampling circuit 28 is equal to the input sample rate of the digital decimation filter 150. A significant advantage of the embodiment of the present invention, including the digital decimation filter 150, is that it produces a digital data output at a lower rate than is provided by the embodiment of FIG. 1A taken alone. If the digital decimation filter 150 has a decimation ratio of 256 and produces 24 bits per word at its output, the data rate reduction would be 24/256, so that the output data rate in bits per second is less than 10% of the input data rate. Another advantage of the embodiment of the present invention including the digital decimation filter 150 is that it provides a filtered digital output in conventional format having a sample rate which is approximately $2\frac{1}{2}$ times the maximum frequency of interest. Thus, the output of the digital decimation filter 150 is compatible with ordinary digital data processing techniques which assume that digital data is in multi-bit words and at a sample rate which is related to the maximum frequency of interest by a ratio which is more than 2:1 and usually less than 5:1.

Figure 9:
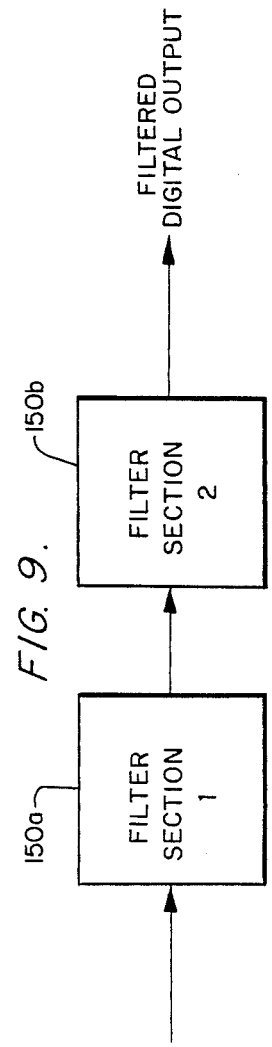
FIG. 9 is a block diagram of an embodiment of the digital decimation filter 150 of FIG. 8 in which the filter 150 comprises plural filter sections.

The digital decimation filter 150 may be formed by a plurality of cascaded filter sections, for example, filter section 150a and filter section 150b, as illustrated in FIG. 9. By dividing the digital decimation filter 150 into two or more sections, the reduction in sampling rate can be divided among the different filter sections, so as to successively slow down the sample rate with each succeeding section. For example, if the filter section 150a is receiving input data at a sample rate of 256,000 samples per second (at 1 bit per sample) and the decimation ratio of section 150a equals 64, then the output sample rate of filter section 150a will be 4,000 samples per second (at 32 bits per sample). In filter section 150b, if the decimation ratio equals 4 then the output sample rate will be 1,000 samples per second (at 24 bits per sample). Thus, the sample rate is decreased considerably.

The digital decimation filter 150 of FIG. 8 (sections 150a and 150b in FIG. 9) may be implemented in numerous ways. There are two categories of digital filters which are known in the literature. One is a finite impulse response (FIR) filter and the other is an infinite impulse response (IIR) filter. A particular implementation of each of these filter categories is described below.

Figure 10:
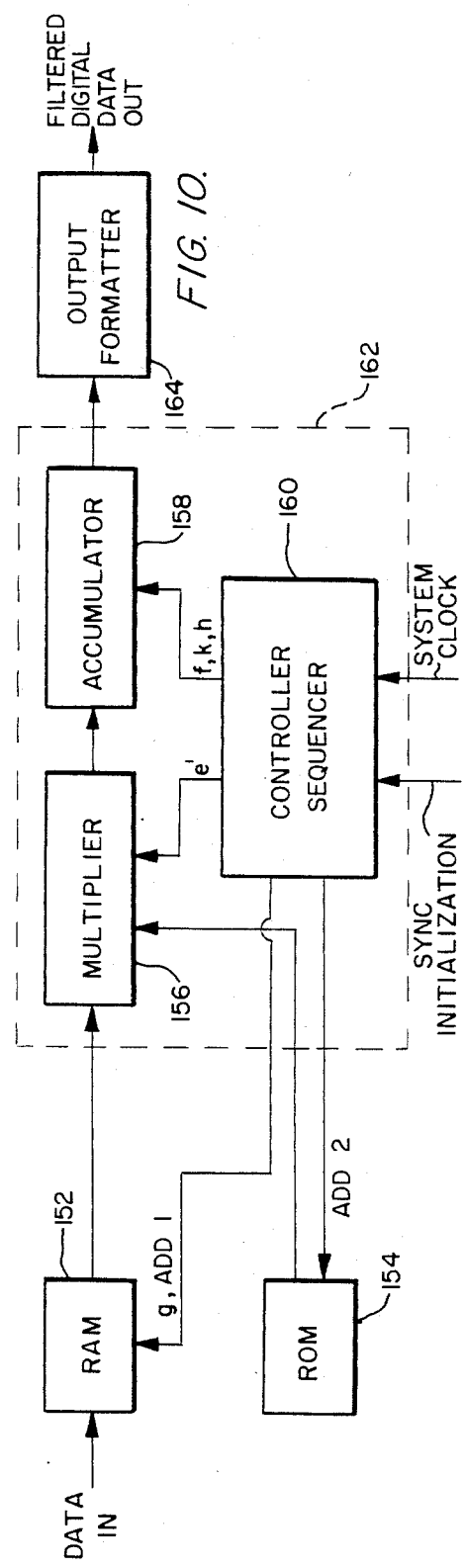
FIG. 10 is a block diagram of the digital decimation filter 150 of FIG. 8, in which the digital decimation filter 150 is a finite impulse response filter.

FIG. 10 is a block diagram of a first embodiment of the digital decimation filter 150 which comprises a finite impulse response (FIR) filter. A random access memory (RAM) 152 receives the digital output from the sampling circuit 28 and temporarily stores this incoming data. As the digital decimation filter 150 progresses through its filtering cycle, new incoming data is written over the oldest data stored in the RAM 152, so that the RAM 152 is constantly updated. A read-only memory (ROM) 152 stores a plurality of coefficients which define the filter characteristics of the digital decimation filter 150. The design of digital filters, and in particular the manner in which these filter coefficients are obtained, is well known in the art and no detailed explanation is deemed necessary. For example, digital filter design is described in "Theory and Application of Digital Signal Processing" by Lawrence R. Rabiner and Bernard Gold, 1975 Prentice-Hall International, Inc., the content of which is hereby incorporated by reference. This book provides Fortran programs for developing sets of coefficients for defining filter characteristics.

Returning to FIG. 10, a multiplier 156 multiplies data read out of the RAM 152 and the coefficients read out of the ROM 154, and the products of this multiplication are output to an accumulator 158 which sums the products output by the multiplier 156. A controller sequencer 160 receives the system clock signal and the synchronization initialization signal and generates a plurality of control signals (e', f, g, k and h (signal e' is unrelated to row e in FIG. 4)) for controlling the operation of the RAM 152, the multiplier 156 and the accumulator 158. In addition, the controller sequencer 160 generates an address ADD 1 for data to be read from or written into the RAM 152 and an address ADD 2 for data to be read from the ROM 154. The accumulator 158 comprises an adder and a register which generate a running subtotal which is updated each time there is an output from the multiplier 156. At predetermined timing, the controller sequencer 160 provides a control signal to the accumulator 158, causing the accumulator 158 to output its current subtotal as a total (i.e. the filtered digital output) and clearing the accumulator to zero. The accumulator 158 then starts running a new subtotal. Any one bit of the filtered digital output is a function of a plurality of consecutive bits of the digital output of the sampling circuit 28. In the preferred embodiment, the multiplier 156, accumulator 158 and controller sequencer 160 are implemented as an integrated circuit 162. In the preferred embodiment, the ROM 154 may be a PROM, to allow additional programming flexibility for the different applications of the digital decimation filter 150 which require different sets of coefficients.

When two or more filter sections are employed (as illustrated in FIG. 9) the first filter section 150a receives single bit words at its input. Thus, the RAM 152 outputs single bit words to the multiplier 156 which means that the multiplier 156 is actually multiplying one bit by N bits and, effectively, amounts to taking the coefficient from the ROM 154 and either adding it to or subtracting it from the value stored in the accumulator 158. Thus, in the first section 150a of the digital decimation filter 150, the multiplier 156 reduces to a controllable digital negator which negates the coefficient from the ROM according to the bit from the RAM.

The embodiment of the digital decimation filter 150 illustrated in FIG. 10 optionally includes an output formatter 164 for formatting the data to make it compatible with the system receiving the filtered digital data output. For example, the output formatter 164 could be a parallel to serial converter, it could convert from sign and magnitude format to twos complement format or vice versa, it could round to shorten word lengths, it could scale to a maximum value or it could be a serial to parallel converter. Similarly, an input formatter (not shown) could be connected to the input of the RAM 152 in order to reformat the input data.

Figure 11:
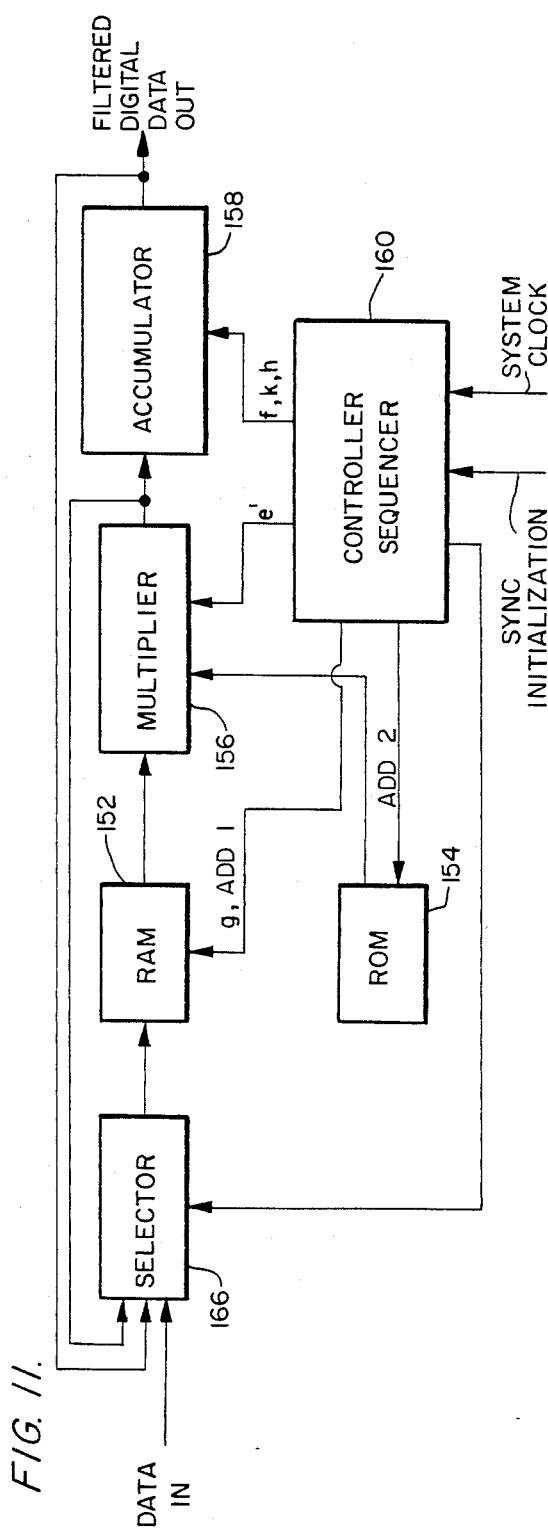
FIG. 11 is a block diagram of an embodiment of the digital decimation filter 150 of FIG. 8, in which the digital decimation filter 150 is an infinite impulse response filter.

FIG. 11 is a block diagram of a second embodiment of the digital decimation filter 150 comprising an infinite impulse response filter. The infinite impulse response filter is similar to the finite impulse response filter illustrated in FIG. 10 and corresponding elements are denoted by the same reference numerals in each figure. In addition to the elements forming the finite impulse response filter of FIG. 10, the infinite impulse response filter includes a selector 166 which is controlled to input to the RAM 152, one of the following:

(1) the digital data input (i.e. the digital output of the sampling circuit 28);

(2) the filtered digital data output (fed back from the output of the accumulator 158); or (3) the output of the multiplier 156. This is a recursive structure which is based on the proposition that a given data output can be computed from earlier data outputs, and if they in turn were functions of still earlier data outputs, this leads to the theoretical result that a finite duration signal at the input can create an infinite duration output signal. Thus, this recursive structure provides feedback of digital quantities within a digital process and this is what makes the filter of FIG. 11 an infinite impulse response filter.

Although the output formatter 164 is not shown in FIG. 11, the infinite impulse response filter may be connected to an output formatter 164 if a particular output format is required. Similarly, depending on the nature of the input and output data (for example, whether it is serial or parallel) it is possible to connect an input formatter to the input of the selector 166 in order to reformat the input data.

As illustrated in FIGS. 10 and 11, the controller sequencer 160 generates the control signals e', f, g, h and k as well as the addresses ADD 1 and ADD 2 in the digital decimation filter 150. An expression which defines the operation of the controller sequencer 160 (and one operating cycle of the digital decimation filter 150) is as follows:

$$(k((e'f)^m g)^n h)$$

In this expression n is the decimation ratio of the filter 150, that is, n is the input sample rate divided by the output sample rate. The filter length (which is also equal to the number of coefficients stored in the ROM 154 and the number of input data points which affect a given output data) is equal to $n \times m$. Thus, m is equal to the filter length divided by the decimation ratio n. The control signals (e', f, g, h and k) comprise pulse signals.

The above expression describes one operating cycle of the filter 150 as follows. Alternating e' pulses and f pulses are emitted by the controller sequencer 160 a total of m times. The e' pulses cause the multiplier 156 to multiply, forming a product upon receipt of each e' pulse. Each of the f pulses causes the accumulator 158 to accumulate the newly formed product. Further, each of the f pulses causes the controller sequencer 160 to increment the addresses ADD 1 (provided to RAM 152) and ADD 2 (provided to ROM 154) to cause the RAM 152 and the ROM 154, respectively, to read the indicated data at the newly incremented addresses out of memory. After m e' pulses and m f pulses have been generated, a g pulse is emitted, thereby causing new input data to be written into the RAM 152. This generation of e', f and g pulses is repeated a total of n times, and is preceded once by a k pulse (clear) and followed by an h pulse. This operating cycle is repeated indefinitely. Each k pulse clears the accumulator 158, resetting its subtotal to zero, and resets the address ADD 2 to zero. Each h pulse causes the accumulator to output its current subtotal as a total, forming one word of the filtered digital data output. The address ADD 1 which is provided to the RAM 152 is reset to zero by certain of the f pulses; that is, those f pulses that occur when address ADD 1 equals the product $n \times m$. Thus, usually each f pulse increments address ADD 1, but when ADD 1 reaches $n \times m$ the next f pulse resets ADD 1 to zero. Thus, one f pulse in every $n \times m + 1$ f pulses resets address ADD 1. Since there are $n \times m$ f pulses in each operating cycle of the controller sequencer 160, the resetting of address ADD 1 occurs at a variable time in successive operating cycles of the sequencer controller 160. This causes a sliding synchronization between the cycles of address ADD 1 and the operating cycles of the controller sequencer 160. This sliding synchronization causes the new data which is continually being written into the RAM 152 to over-write the oldest data in the RAM 152. The sliding synchronization does not cause any disadvantages; particularly, it does not result in any appearance of a long cycle which theoretically could occur as a beat frequency process. The dependence of the filtered digital data output upon the data input does not vary in dependence upon the instantaneous phase relationship embodied in this sliding synchronization.

Figure 12:
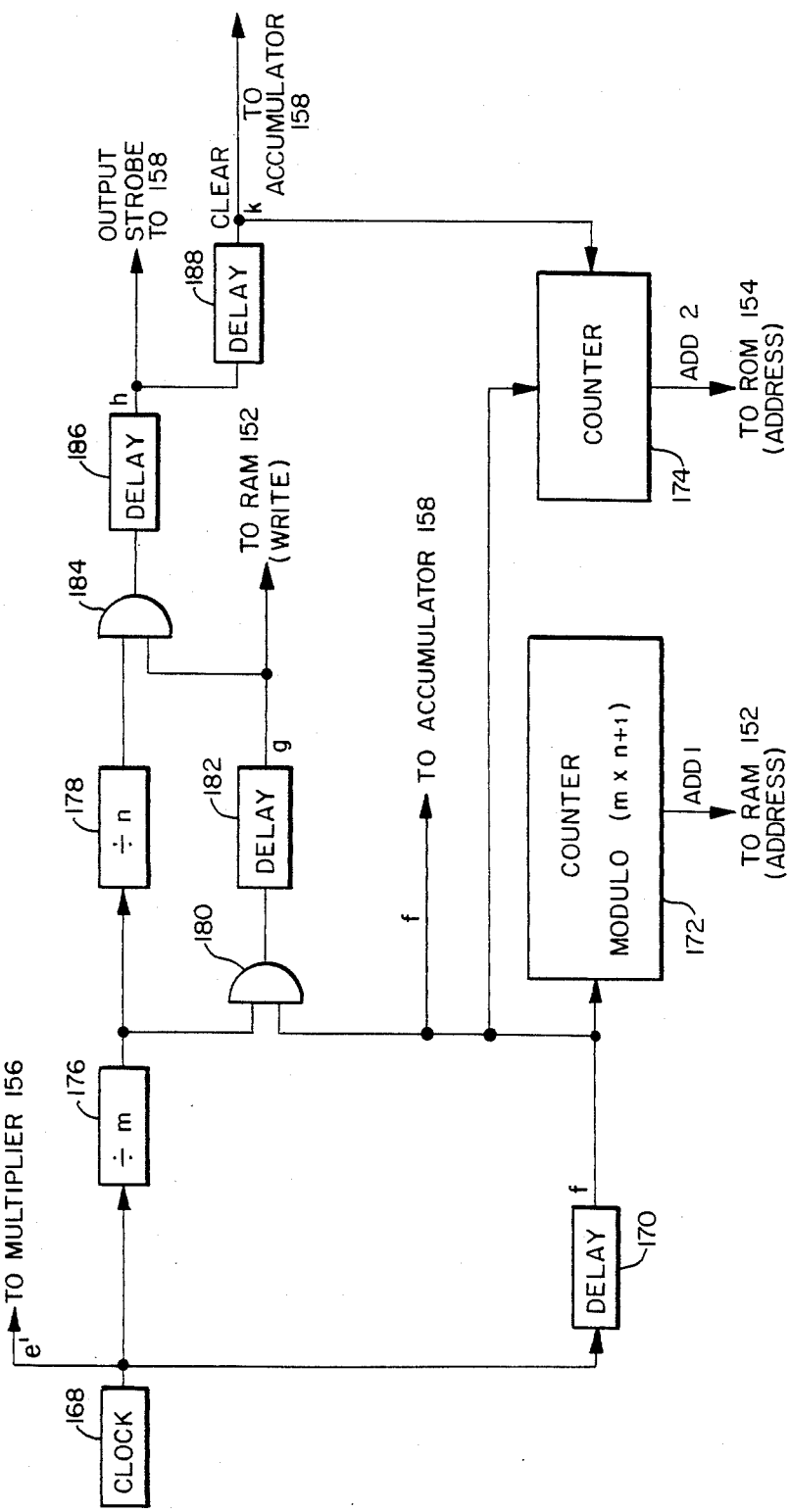
FIG. 12 is a block diagram of the controller sequencer 160 of FIG. 10.

Referring to FIG. 12, an embodiment of the controller sequencer 160 will be described. A clock 168 which may be the system clock, provides the control signal e' which is used to control the operation of the multiplier 156. A delay circuit 170 delays the control signal e' to produce the control signal f which is used to control the operation of accumulator 158, and which is input to counters 172 and 174. The counter 172 is a modulo $m \times n + 1$ counter, and each time counter 172 receives an f pulse it increments (modulo $m \times n + 1$) the address ADD 1 which is used to write in and to read-out the input data from the RAM 152. Similarly, the counter 174 increments the address ADD 2 for reading the coefficients out of the ROM 154 each time an f pulse is received. The counter 172 does not have a reset but merely advances to its upper limit and recycles to the bottom on the next pulse. A frequency divider 176 divides the output of the clock 168 by m and the output of the divider 176 is divided by n by a frequency divider 178. The output of the frequency divider 176 is also ANDED with the control signal f by an AND gate 180, and the output of AND gate 180 is delayed by a delay circuit 182 to produce the control signal g which causes new input data to be written into the RAM 152. An AND gate 184 ANDS the output of the frequency divider 178 with the control signal g and the output of AND gate 184 is delayed by delay circuit 186 which outputs the control signal h. The control signal h is delayed by a delay circuit 188 which produces, at its output, the clear control signal k which clears the counter 174 and the accumulator 158.

As an example of the operation of the controller sequencer 160, if the decimation ratio (n) equals 256 and m equals 32 then the filter length is 8,192. As the control pulses e' and f are generated, the RAM 152 and ROM 154 provide input data and coefficients, respectively, which are multiplied by the multiplier 156 and accumulated by the accumulator 158. After m (32) sets of control pulses e' and f, one data point in the RAM 152 is over-written with new input data. During one operating cycle (m×n e' and f pulses) all of the data in the RAM 152 is read out except for one data point from whatever the starting point is. It should be noted that while there are m×n pulses, the counter 172 is modulo m×n+1, so that the beginning of each cycle as defined by the above expression will start with a different RAM address each time, offset from the previous starting address by a single data point. That is, in this example, the RAM 152 has 8,193 data points and in one cycle 8,192 of the data points are read out. Since n equals 256, during one operating cycle 256 data points in the RAM 152 (out of 8,193) will be over-written or updated with new data. During the next operating cycle an adjacent 256 data points distributed throughout the RAM 152 are updated, and so on. Thus, in this example, it takes 32 cycles to update the entire contents of RAM 152, so that on the 33rd cycle, data points which were over-written on the first cycle will be over-written again. Thus, the offset provided by the modulo m×n+1 counter 172 provides for the updating of the oldest data points stored in the RAM.

The enhanced delta modulation encoder 10 of the present invention may be implemented in numerous ways. For example, although the spectrum tilter 24 has been illustrated by embodiments employing three and four integrating circuits, the spectrum tilter 24 could be expanded to include any desired number (e.g., N, where N is an integer greater than or equal to 3) of integrating circuits as long as the clipper 36 (or several clippers) is connected across N-1 of the integrating capacitors. In addition, the analog input signal can be introduced into the overall feedback loop of the enhanced delta modulation encoder 10 at a point inside the spectrum tilter 24, or at its output. Furthermore, the summer 20 of FIG. 1A may be inverting or non-inverting at either of its inputs, and each of the elements in the feedback loop (the spectrum tilter 24, the 1 bit A/D converter 26, the sampling circuit 28 and the 1 bit D/A converter 34) may be inverting or non-inverting. The only constraint is that the feedback loop gain must be negative, so that all signs except any one in the loop can be chosen arbitrarily. With respect to the internal decoder 22, the two pulse types which are generated by the internal decoder 22 may differ in height, width, shape, magnitude of area, and time of occurrence relative to a regular bit rate clock. One of the pulse types may be a null-pulse, i.e., the absence of a pulse, and the base line on the internal decoder output may be non-zero. The decimation filter 150 may be embodied as any filter which is capable of providing a filtered output compatible with the system which is to receive and process the data encoded by the enhanced delta modulation encoder 10. A digital processor may be interposed at the output of the sampling circuit 28 so that the output of the digital processor is the digital output and also the input to the internal decoder 22.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desirable to limit the invention to the exact construction and operation shown and described and, accordingly, all suitable modifications and equivalents may be resorted to, falling within the scope of the invention.

What is claimed is:

1. An analog-to-digital encoder for converting an analog input signal to a digital output, comprising:
   first means for receiving the analog input signal and for generating an analog dither signal;
   second means, operatively connected to said first means, for receiving the analog dither signal and for generating a flattened analog signal, said second means having more than 180° of phase lag at certain frequencies, said second means including means for reducing the phase lag below 180°;
   third means, operatively connected to said second means, for receiving the flattened analog signal and for generating the digital output; and
   fourth means, operatively connected to said third means and to said first means, for feeding back the digital output to said first means by generating an internal analog signal and providing the internal analog signal to said first means, said first means adding the analog input signal and internal analog signal to obtain the analog dither signal.

2. An analog-to-digital encoder as set forth in claim 1, wherein said second means comprises a spectrum tilter comprising:
   a first integrating circuit operatively connected to said first means;
   a second integrating circuit operatively connected to said first integrating circuit;
   a third integrating circuit operatively connected to said second integrating circuit and said third means; and
   a clipping circuit operatively connected in parallel to said second and third integrating circuits.

3. An analog-to-digital encoder as set forth in claim 1, wherein said second means comprises a spectrum tilter comprising:
   a first integrating circuit operatively connected to said first means;
   a second integrating circuit operatively connected to said first integrating circuit;
   a third integrating circuit operatively connected to said second integrating circuit;
   a fourth integrating circuit operatively connected to said third integrating circuit and said third means; and
   a clipping circuit, operatively connected in parallel to said second, third and fourth integrating circuits.

4. An analog-to-digital encoder as set forth in claim 1, wherein said second means comprises a spectrum tilter comprising:
   at least three integrating circuits connected between said first means and said third means; and
   a clipping circuit connected in parallel to two of said at least three integrating circuits.

5. An analog-to-digital encoder as set forth in claim 1, wherein said second means comprises a spectrum tilter comprising:
   N integrating circuits, where N is an integer greater than or equal to 3, connected between said first means and said third means; and
   a clipping circuit connected in parallel to N-1 of said N integrating circuits.

6. An analog-to-digital encoder as set forth in claim 1, 2, 3, 4 or 5, further comprising timing means, operatively connected to said third means and said fourth means, for providing a first timing signal to said third means and for providing a second timing signal to said fourth means, wherein said third means generates the digital output in dependence upon said first timing signal, and wherein said fourth means generates the internal analog signal in dependence upon said second timing signal.

7. An analog-to-digital encoder as set forth in claim 6, wherein said fourth means comprises a decoder circuit connected to said timing means, said third means and said first means.

8. An analog-to-digital encoder as set forth in claim 7, wherein said decoder circuit comprises a one bit digital-to-analog converter.

9. An analog-to-digital encoder as set forth in claim 7, wherein said third means comprises:
an analog-to-digital converter operatively connected to said second means; and
a sampling circuit operatively connected to said analog-to-digital converter and said decoder circuit.

10. An analog-to-digital encoder as set forth in claim 9, wherein said sampling circuit comprises a flip-flop.

11. An analog-to-digital encoder as set forth in claim 10, wherein said analog-to-digital converter is a one bit analog-to-digital converter.

12. An analog-to-digital encoder as set forth in claim 11, wherein said one bit analog-to-digital converter is a comparator.

13. An analog-to-digital encoder, comprising:
timing means for generating first and second timing signals;
first means for providing an analog input signal;
second means, operatively connected to said first, means, for providing an analog dither signal;
a spectrum tilter, operatively connected to said second means, for receiving the analog dither signal and for generating a flattened analog signal, said spectrum tilter having more than 180° of phase lag at certain frequencies, said spectrum tilter including means for reducing the phase lag below 180°;
an analog to digital converter, operatively connected to said spectrum tilter, for receiving the flattened analog signal and for generating a digital signal;
a sampling circuit, operatively connected to said analog-to-digital converter and said timing means, for providing a digital output, comprising a serial bit stream, in dependence upon the digital signal and the first timing signal; and
feedback means, operatively connected to said sampling circuit, said timing means and said second means, for providing an internal analog signal to said second means in dependence upon the second timing signal and the digital output, said second means adding the analog input signal and the internal analog signal to generate the analog dither signal.

14. An analog-to-digital encoder as set forth in claim 13, wherein said spectrum tilter comprises:
a first integrating circuit operatively connected to said second means;
a second integrating circuit operatively connected to said first integrating circuit;
a third integrating circuit operatively connected between said second integrating circuit and said analog-to-digital converter; and
a clipping circuit operatively connected in parallel to said second and third integrating circuits.

15. An analog-to-digital encoder as set forth in claim 13, wherein said spectrum tilter comprises:
a first integrating circuit operatively connected to said second means;
a second integrating circuit operatively connected to said first integrating circuit;
a third integrating circuit operatively connected to said second integrating circuit;
a fourth integrating circuit operatively connected between said third integrating circuit and said analog-to-digital converter; and
a clipping circuit, operatively connected in parallel to said second, third and fourth integrating circuits.

16. An analog-to-digital encoder as set forth in claim 13, wherein said spectrum tilter comprises:
at least three integrating circuits connected between said second means and said analog to digital converter; and
a clipping circuit connected in parallel to two of said at least three integrating circuits.

17. An analog-to-digital encoder as set forth in claim 13, wherein said spectrum tilter comprises:
N integrating circuits, where N is an integer greater than or equal to 3, connected between said second means and said analog-to-digital converter; and
a clipping circuit connected in parallel to N-1 of said N integrating circuits.

18. An analog-to-digital encoder as set forth in claim 13, 14, 15, 16 or 17, wherein said feedback means comprises a decoder circuit connected to said timing means, said sampling circuit and said second means.

19. An analog-to-digital encoder as set forth in claim 18, wherein said decoder circuit comprises a digital-to-analog converter.

20. An analog-to-digital encoder as set forth in claim 19, wherein said analog-to-digital converter is a one bit analog-to-digital converter.

21. An analog-to-digital encoder, comprising:
timing means for generating a first timing signal;
first means for providing an analog input signal;
second means, operatively connected to said first means, for providing an analog dither signal;
a spectrum tilter, operatively connected to said second means, for receiving the analog dither signal and for generating a flattened analog signal, said spectrum tilter comprising:
at least three integrating circuits operatively connected to said second means; and
a clipping circuit connected in parallel to two of said at least three integrating circuits;
an analog-to-digital converter, operatively connected to said spectrum tilter, for receiving the flattened analog signal and generating a digital signal; and
feedback means, operatively connected to said analog-to-digital converter, said timing means and said second means, for providing an internal analog signal to said second means in dependence upon the first timing signal and the digital signal, said second means adding the analog input signal and the internal analog signal to obtain the analog dither signal.

22. An analog-to-digital encoder as set forth in claim 21, wherein said timing means generates a second timing signal, further comprising a sampling circuit, operatively connected between said analog-to-digital converter, said timing means and said feedback means, for providing a digital output comprising a serial bit stream in dependence upon said digital signal and said second timing signal.

23. An analog-to-digital encoder for converting an analog input signal to a digital output, comprising:
first means for receiving the analog input signal and for generating an analog dither signal;
second means, operatively connected to said first means, for receiving the analog dither signal and for generating a flattened analog signal;
third means, operatively connected to said second means, for receiving the flattened analog signal and for generating the digital output;
fourth means, operatively connected to said third means, for receiving the digital output and for generating an internal analog signal; and
fifth means, operatively connected to said fourth means and said first means, for receiving the internal analog signal and for generating a flattened internal analog signal, said first means adding the analog input signal and the flattened internal analog signal to obtain the analog dither signal, said second means and said fifth means together generating more than 180° of phase lag at certain frequencies, at least one of said second means and said fifth means including means for reducing the phase lag below 180°.

24. An analog-to-digital encoder, comprising:
timing means for generating a first timing signal;
first means for providing an analog input signal;
second means, operatively connected to said first means, for providing an analog dither signal;
a spectrum tilter, operatively connected to said second means, for receiving the analog dither signal and for generating a flattened analog signal, said spectrum tilter comprising;
at least three integrating circuits operatively connected to said second means; and
a clipping circuit connected in parallel to two of said at least three integrating circuits;
an analog-to-digital converter, operatively connected to said spectrum tilter, for receiving the flattened analog signal and generating a digital signal;
feedback means, operatively connected to said analog-to-digital converter, said timing means and said second means, for providing an internal analog signal to said second means in dependence upon the first timing signal and the digital signal, said second means adding the analog input signal and the internal analog signal to obtain the analog dither signal; and
a digital processor, operatively connected to said analog-to-digital converter, for processing the digital signal.

25. An analog-to-digital encoder for converting an analog input signal to a digital output, comprising:
first means for receiving the analog input signal and for generating an analog dither signal;
second means, operatively connected to said first means, for receiving the analog dither signal and for generating a flattened analog signal;
third means, operatively connected to said second means, for receiving the flattened analog signal and for generating the digital output;
fourth means, operatively connected to said third means, for receiving the digital output and for generating an internal analog signal;
fifth means, operatively connected to said fourth means and said first means, for receiving the internal analog signal and for generating a flattened internal analog signal, said first means adding the analog input signal and the flattened internal analog signal to obtain the analog dither signal, said second means and said fifth means together generating more than 180° of phase lag at certain frequencies, at least one of said second means and said fifth means including means for reducing the phase lag below 180°; and
a digital processor, operatively connected to said third means, for processing the digital output.

26. An analog-to-digital encoder for converting an analog input signal, having a predetermined frequency band of interest, to a digital output, comprising:
first means for receiving the analog input signal and for generating an analog dither signal;
second means, operatively connected to said first means, for receiving the analog dither signal and for generating a flattened analog signal, said second means having more than 180° of phase lag at certain frequencies within the frequency band of interest, said second means including means for preventing said analog-to-digital encoder from entering a limit cycle;
third means, operatively connected to said second means, for receiving the flattened analog signal and for generating the digital output;
fourth means, operatively connected to said third means and to said first means, for feeding back the digital output to said first means by generating an internal analog signal and providing the internal analog signal to said first means, said first means adding the analog input signal and the internal analog signal to obtain the analog dither signal; and
a digital processor, operatively connected to said third means, for processing the digital output.

27. An analog-to-digital encoder for converting an analog input signal, having a predetermined frequency band of interest, to a digital output, comprising:
first means for receiving the analog input signal and for generating an analog dither signal;
second means, operatively connected to said first means, for receiving the analog dither signal and for generating a flattened analog signal, said second means having more than 180° of phase lag at certain frequencies within the frequency band of interest, said second means including means for preventing said analog-to-digital encoder from entering a limit cycle;
third means, operatively connected to said second means, for receiving the flattened analog signal and for generating the digital output; and
fourth means, operatively connected to said third means and to said first means, for feeding back the digital output to said first means by generating an internal analog signal and providing the internal analog signal to said first means, said first means adding the analog input signal and the internal analog signal to obtain the analog dither signal.

28. An analog-to-digital encoder for converting an analog input signal to a digital output, comprising:
first means for receiving the analog input signal and for generating an analog dither signal;
second means, operatively connected to said first means, for receiving the analog dither signal and for generating a flattened analog signal, said second means having more than 180° of phase lag at certain frequencies, said second means including means for reducing the phase lag below 180°;

third means, operatively connected to said second means, for receiving the flattened analog signal and for generating the digital output;

fourth means, operatively connected to said third means and to said first means, for feeding back the digital output to said first means by generating an internal analog signal and providing the internal analog signal to said first means, said first means adding the analog input signal and internal analog signal to obtain the analog dither signal; and a digital processor, operatively connected to said third means, for processing the digital output.

29. An analog-to-digital encoder, comprising:

timing means for generating first and second timing signals;

first means for providing an analog input signal;

second means, operatively connected to said first means, for providing an analog dither signal;

a spectrum tilter, operatively connected to said second means, for receiving the analog dither signal and for generating a flattened analog signal, said spectrum tilter having more than 180° of phase lag at certain frequencies, said spectrum tilter including means for reducing the phase lag below 180°;

an analog-to-digital converter, operatively connected to said spectrum tilter, for receiving the flattened analog signal and for generating a digital signal;

a sampling circuit, operatively connected to said analog-to-digital converter and said timing means, for providing a digital output, comprising a serial bit stream, in dependence upon the digital signal and the first timing signal;

feedback means, operatively connected to said sampling circuit, said timing means and said second means, for providing an internal analog signal to said second means in dependence upon the second timing signal and the digital output, said second means adding the analog input signal and the internal analog signal to generate the analog dither signal; and a digital processor, operatively connected to said sampling circuit, for processing the digital output.

* * * * *